(12) United States Patent
Kawashiro

(10) Patent No.: US 12,707,998 B2
(45) Date of Patent: Aug. 11, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Fumiyoshi Kawashiro, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 372 days.

(21) Appl. No.: 18/243,290

(22) Filed: Sep. 7, 2023

(65) Prior Publication Data

US 2024/0105561 A1 Mar. 28, 2024

(30) Foreign Application Priority Data

Sep. 22, 2022 (JP) ................................ 2022-151641
Jul. 24, 2023 (JP) ................................ 2023-120085

(51) Int. Cl.
*H10W 70/40* (2026.01)
*H10W 72/00* (2026.01)
(Continued)

(52) U.S. Cl.
CPC ....... *H10W 70/481* (2026.01); *H10W 90/756* (2026.01); *H10W 70/415* (2026.01); *H10W 72/073* (2026.01); *H10W 72/07331* (2026.01); *H10W 72/07336* (2026.01); *H10W 72/07354* (2026.01); *H10W 72/075* (2026.01); *H10W 72/07533* (2026.01); *H10W 72/347* (2026.01);
(Continued)

(58) Field of Classification Search
CPC ............ H10W 70/481; H10W 70/415; H10W 72/073; H10W 72/07331; H10W 72/07336; H10W 72/07354; H10W 72/075; H10W 72/07533; H10W 72/347; H10W 72/352; H10W 72/5449; H10W 72/552; H10W 72/5522; H10W 72/5525; H10W 72/555; H10W 72/865; H01L 23/49562; H01L 23/3121; H01L 23/4951; H01L 24/06; H01L 24/29; H01L 24/45; H01L 24/48; H01L 24/78
See application file for complete search history.

(56) References Cited

U.S. PATENT DOCUMENTS 8,912,640 B2 12/2014 Takada et al.
10,109,614 B2 10/2018 Lopez et al.
(Continued)

FOREIGN PATENT DOCUMENTS

DE 102015116152 A1 4/2016
JP 2006-203048 A 8/2006
(Continued)

*Primary Examiner* — Steven B Gauthier
*Assistant Examiner* — Marc-Anthony Armand
(74) *Attorney, Agent, or Firm* — Kim & Stewart LLP

(57) ABSTRACT

According to one embodiment, there is provided a semiconductor device including a chip, a drain electrode arranged on a first surface of the chip, a source electrode arranged on a second surface provided on a back side of the first surface of the chip and having a front surface on a device bottom surface, a gate electrode having a front surface on the device bottom surface, and a wire connecting a first region of the gate electrode to a second region on the second surface of the chip.

8 Claims, 8 Drawing Sheets

(51) Int. Cl.

| | |
|---|---|
| ***H10W 72/30*** | (2026.01) |
| ***H10W 72/50*** | (2026.01) |
| ***H10W 72/90*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ...... *H10W 72/352* (2026.01); *H10W 72/5449* (2026.01); *H10W 72/552* (2026.01); *H10W 72/5522* (2026.01); *H10W 72/5525* (2026.01); *H10W 72/555* (2026.01); *H10W 72/865* (2026.01); *H10W 72/884* (2026.01); *H10W 72/926* (2026.01); *H10W 72/944* (2026.01); *H10W 74/01* (2026.01); *H10W 74/114* (2026.01); *H10W 90/736* (2026.01)

(56) References Cited

U.S. PATENT DOCUMENTS

| | | | | |
|---|---|---|---|---|
| 10,930,582 | B2 | 2/2021 | Lopez et al. | |
| 2006/0138532 | A1* | 6/2006 | Okamoto ............ | H10W 70/481 257/E23.044 |
| 2007/0182003 | A1 | 8/2007 | Huber | |
| 2008/0087992 | A1* | 4/2008 | Shi ...................... | H10W 70/466 257/E23.044 |
| 2010/0078784 | A1 | 4/2010 | Otremba | |
| 2016/0118320 | A1 | 4/2016 | Coppone et al. | |

FOREIGN PATENT DOCUMENTS

| | | | |
|---|---|---|---|
| JP | 5868043 | B2 | 2/2016 |
| JP | 6509885 | B2 | 5/2019 |
| JP | 6709785 | B2 | 5/2020 |
| JP | 2020-107637 | A | 7/2020 |
| JP | 6805768 | B2 | 12/2020 |

* cited by examiner

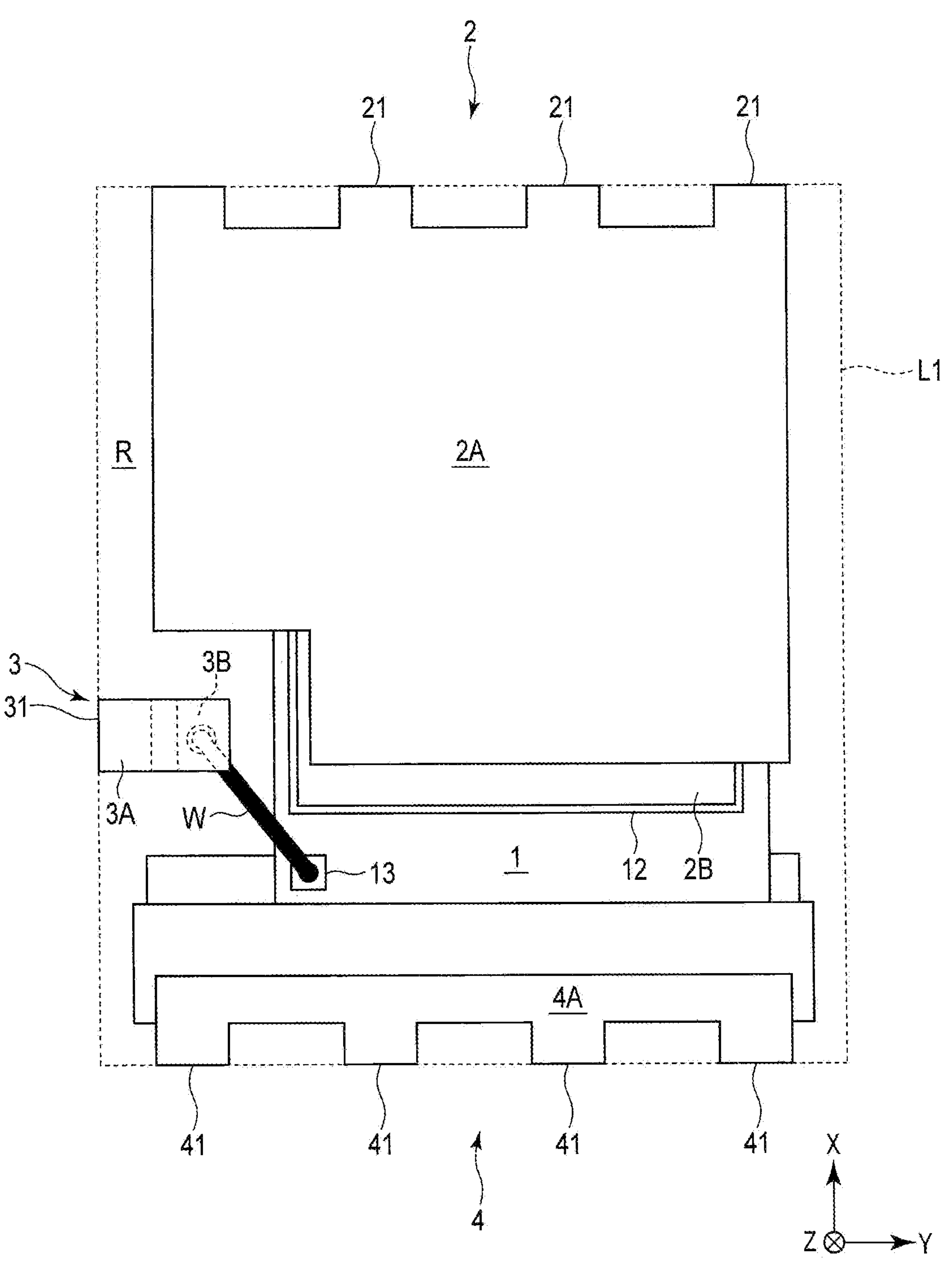
F I G. 2

SEMICONDUCTOR DEVICE

CROSS-REFERENCE TO RELATED APPLICATIONS

This application is based upon and claims the benefit of priority from Japanese Patent Applications No. 2022-151641, filed Sep. 22, 2022, and No. 2023-120085, filed Jul. 24, 2023, the entire contents of all of which are incorporated herein by reference.

FIELD

Embodiments described herein relate generally to a semiconductor device.

BACKGROUND

A chip and various electrodes are mounted on a semiconductor device. On the chip, regions where the various electrodes are connected are provided.

It is desirable for the above chip to have a large active area.

BRIEF DESCRIPTION OF THE DRAWINGS

FIG. 2 is a plan view showing an example of a structure of the semiconductor device shown in FIG. 1 as viewed in a Z direction.

DETAILED DESCRIPTION

Embodiments will be described below with reference to the drawings. In general, according to one embodiment, there is provided a semiconductor device including a chip, a drain electrode arranged on a first surface of the chip, a source electrode arranged on a second surface provided on a back side of the first surface of the chip and having a front surface on a device bottom surface, a gate electrode having a front surface on the device bottom surface, and a wire connecting a first region of the gate electrode to a second region on the second surface of the chip.

(Configuration of Semiconductor Device)

A configuration of a semiconductor device according to a present embodiment will be described with reference to FIGS. 1 and 2.

Figure 1:
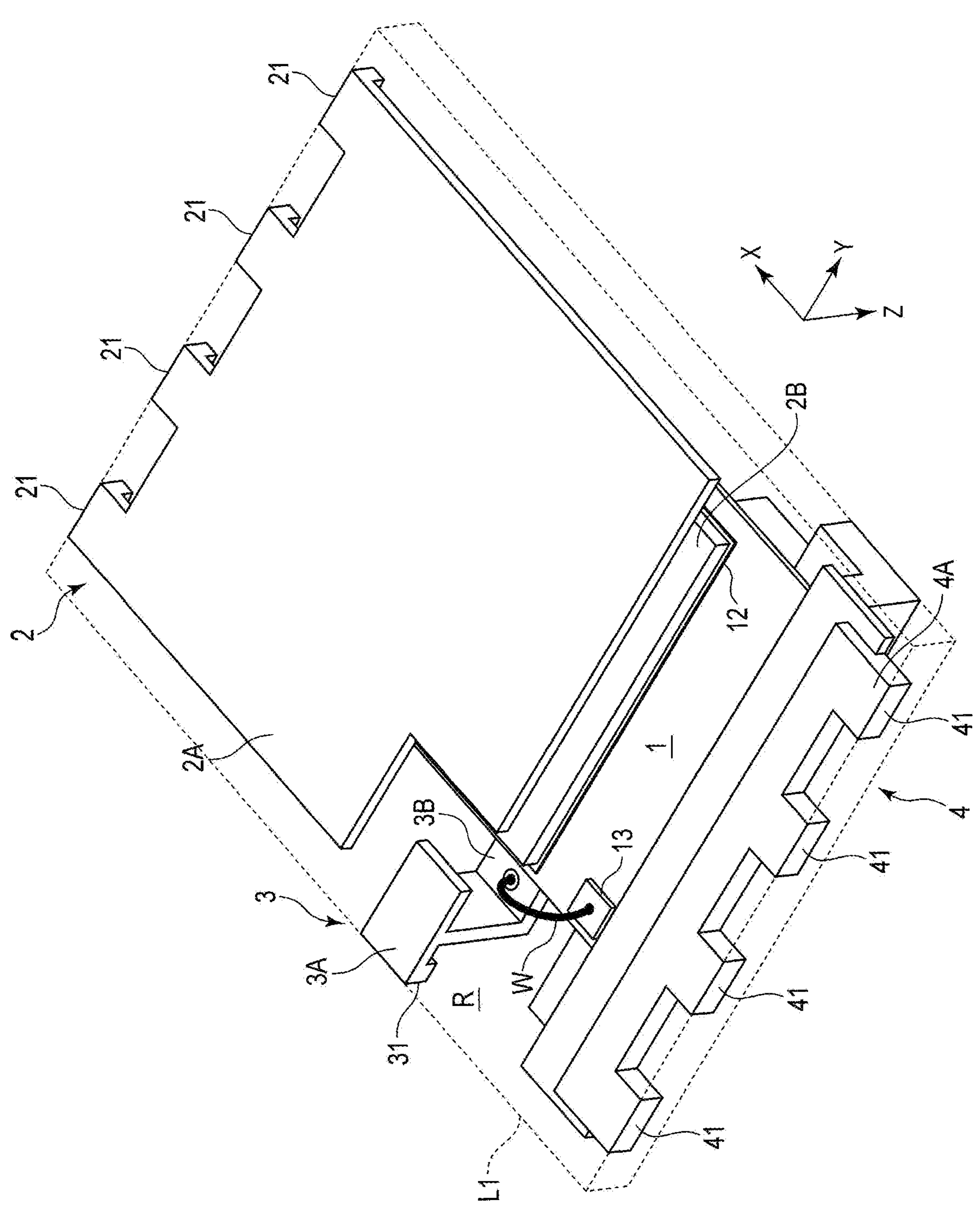
FIG. 1 is a perspective view showing an example of a structure of a part of a semiconductor device according to an embodiment.

FIG. 1 is a perspective view showing an example of a structure of a part of the semiconductor device according to the present embodiment. FIG. 2 is a plan view showing an example of a structure of the semiconductor device shown in FIG. 1 as viewed in a Z direction. X, Y, and Z in each figure indicate a positional relationship of the semiconductor device in a three-dimensional space. The structure shown in FIGS. 1 and 2 is merely an example, and the structure is not limited to this example. Arrangement relationships, shapes, sizes, etc. of the components may be changed as appropriate.

The semiconductor device exemplified in the present embodiment is a semiconductor device sealed in a package of a source-down structure in which a source electrode is provided on a bottom surface of the package. FIG. 1 shows a state in which the source electrode faces upward (i.e., a state in which the semiconductor device is turned upside down) to facilitate visualization of a main part.

As shown in FIG. 1, the semiconductor device includes a chip 1, a source electrode 2, a gate electrode 3, a drain electrode 4, etc. In addition, a resin (sealing resin) R is sealed to fit within a range of a broken line L1. The resin R is, for example, an epoxy resin.

The chip 1 is formed by, for example, an integrated circuit (IC), and includes, for example, a field effect transistor (FET) such as a MOSFET. Each of the source electrode 2, the gate electrode 3, and the drain electrode 4 is formed of an electrically conductive material, e.g., a metallic material such as a copper.

The chip 1 has a region for arranging the source electrode 2 and a region for arranging the gate electrode 3 on a second surface, and a region for arranging the drain electrode 4 on a first surface (not shown in FIG. 1) provided on a back side of the second surface. In the region for arranging the source electrode 2, a source electrode pad 12 is provided. In the region for arranging the gate electrode 3, a gate electrode pad 13 is provided. The region with the source electrode pad 12 and the region with the gate electrode pad 13 are physically and electrically separated by a polyimide layer.

The source electrode 2 includes a source electrode external exposed portion 2A and a source electrode pad connection portion 2B. The source electrode external exposed portion 2A includes a source electrode terminal 21. The source electrode 2 has, for example, a plate-like shape, and has a source pad connection portion 2B connected to the chip 1 via solder on a front surface and the source electrode external exposed portion 2A on a side of a back surface, which is a surface opposite to the front surface.

The source electrode external exposed portion 2A is a portion having a surface (an external exposed surface) to be exposed outside after sealing the resin R. The source electrode pad connection portion 2B is a portion formed integrally with the source electrode external exposed portion 2A and having a surface to be connected to the source electrode pad 12. The source electrode terminal 21 is a part of the source electrode external exposed portion 2A, and corresponds to a lead terminal (or a lead pin) for electrical connection with an external entity. When viewed from a bottom surface side of the semiconductor device (or from below a side of the second surface of the chip 1), i.e., when viewed from a direction perpendicular to the second surface of the chip 1, the source electrode external exposed portion 2A has a region that overlaps with the second surface of the chip 1. In other words, in a Z-axis direction, the source electrode external exposed portion 2A has a region that overlaps with the second surface of the chip 1.

The gate electrode 3 includes a gate electrode external exposed portion 3A and a gate electrode internal connection portion 3B. The gate electrode 3, for example, has a structure in which a plate-shaped metal member is bent.

The gate electrode external exposed portion 3A includes a gate electrode terminal 31. The gate electrode terminal 31 is a part of the gate electrode external exposed portion 3A, and corresponds to a lead terminal (or a lead pin) for electrical connection with an external entity.

The gate electrode external exposed portion 3A has a surface (an external exposed surface) to be exposed outside after sealing the resin R. Specifically, the gate electrode external exposed portion 3A has an external exposed surface that is flush with an external exposed surface of the resin R. The source electrode external exposed portion 2A of the source electrode 2 also has an external exposed surface that is flush with the external exposed surface of the resin R. That is, the external exposed surface of the gate electrode external exposed portion 3A, the external exposed surface of the resin R, and the external exposed surface of the source electrode external exposed portion 2A form one plane.

The gate electrode internal connection portion 3B has a region for connecting one end of a wire W. The other end of the wire W is connected to the gate electrode pad 13. A surface of the gate electrode internal connection portion 3B and a surface of the gate electrode pad 13 on the back surface of the chip 1 both face from the second surface of the chip 1 in a direction of the source electrode (a negative Z-axis direction). In other words, the gate electrode internal connection portion 3B has a surface parallel to the surface of the gate electrode pad 13. Therefore, the gate electrode internal connection portion 3B and the gate electrode pad 13 can be easily connected together by the wire W. In this case, the surface of the gate electrode internal connection portion 3B faces the same direction (the negative Z-axis direction) as the surface of the source electrode external exposed portion 2A.

For the wire W, for example, gold, silver, or copper is used. Nickel-gold plating, for example, is used to connect the wire W to the gate electrode pad 13. Silver plating, for example, is used to connect the wire W to the gate electrode internal connection portion 3B. However, the examples given here are merely examples, and the connections are not limited thereto. Each connection is preferably a precious metal-to-precious metal connection.

Since the gate electrode pad 13 realizes electrical connection with the gate electrode 3 simply by connecting the wire W, the region of the gate electrode pad 13 on the chip 1 can be made small, and the region on the chip 1 other than this region can be made large, thus securing a large active area. This would also allow a current rating of the device to be increased.

Since an area of a bonding portion with the wire W can be reduced, durability of the bonding portion against thermal stress due to heat generated by the chip 1 can be improved, which can extend a service life of the component and realize cost reduction.

The drain electrode 4 includes a drain electrode external exposed portion 4A. The drain electrode external exposed portion 4A includes a drain electrode terminal 41. The drain electrode external exposed portion 4A is a portion having a surface (an external exposed surface) to be exposed outside after sealing the resin R. The drain electrode terminal 41 is a part of the drain electrode external exposed portion 4A, and corresponds to a lead terminal (or a lead pin) for electrical connection with an external entity. The drain electrode 4, for example, has a shape of a plate-like metal member that is bent. The drain electrode terminal 41 is, for example, provided on a side surface of the semiconductor device.

Portions to be exposed from the package after resin sealing are the external exposed surface of the source electrode external exposed portion 2A (including an external exposed surface of the source electrode terminal 21), the external exposed surface of the gate electrode external exposed portion 3A (including an external exposed surface of the gate electrode terminal 31), and the external exposed surface of the drain electrode external exposed portion 4A (including an external exposed surface of the drain electrode terminal 41).

FIGS. 1 and 2 show an example of a case in which the external exposed surface of each of the source electrode terminal 21, the gate electrode terminal 31, and the drain electrode terminal 41 is flush with a front surface of the resin R adjacent thereto. In this example, the package forms a cuboid without protrusions and thus is easy to handle. However, the structure is not limited to this example, and the source electrode terminal 21, the gate electrode terminal 31, and the drain electrode terminal 41 may have a structure protruding outside the front surface of the adjacent resin R by a predetermined distance. Depending on the form of a connection destination, the protruding structure may be preferred.

Although illustration is omitted in FIGS. 1 and 2, the source electrode 2 and the drain electrode 4 are bonded to the chip 1 with solder. However, a hard-to-melt sintered material (e.g., copper, silver, lead, tin-copper compound, tin-silver compound, or tin-nickel compound) may be used instead of solder. In such cases, a pressure-sintered material with excellent pressure resistance may be used. In other words, the source electrode 2 and the drain electrode 4 may be bonded to the chip 1 via the pressure-sintered material.

(Outline of Manufacturing Process)

Next, an outline of a manufacturing process of the semiconductor device according to the present embodiment will be described with reference to FIG. 3. A specific example of the manufacturing process of the semiconductor device will be described later.

Figure 3:
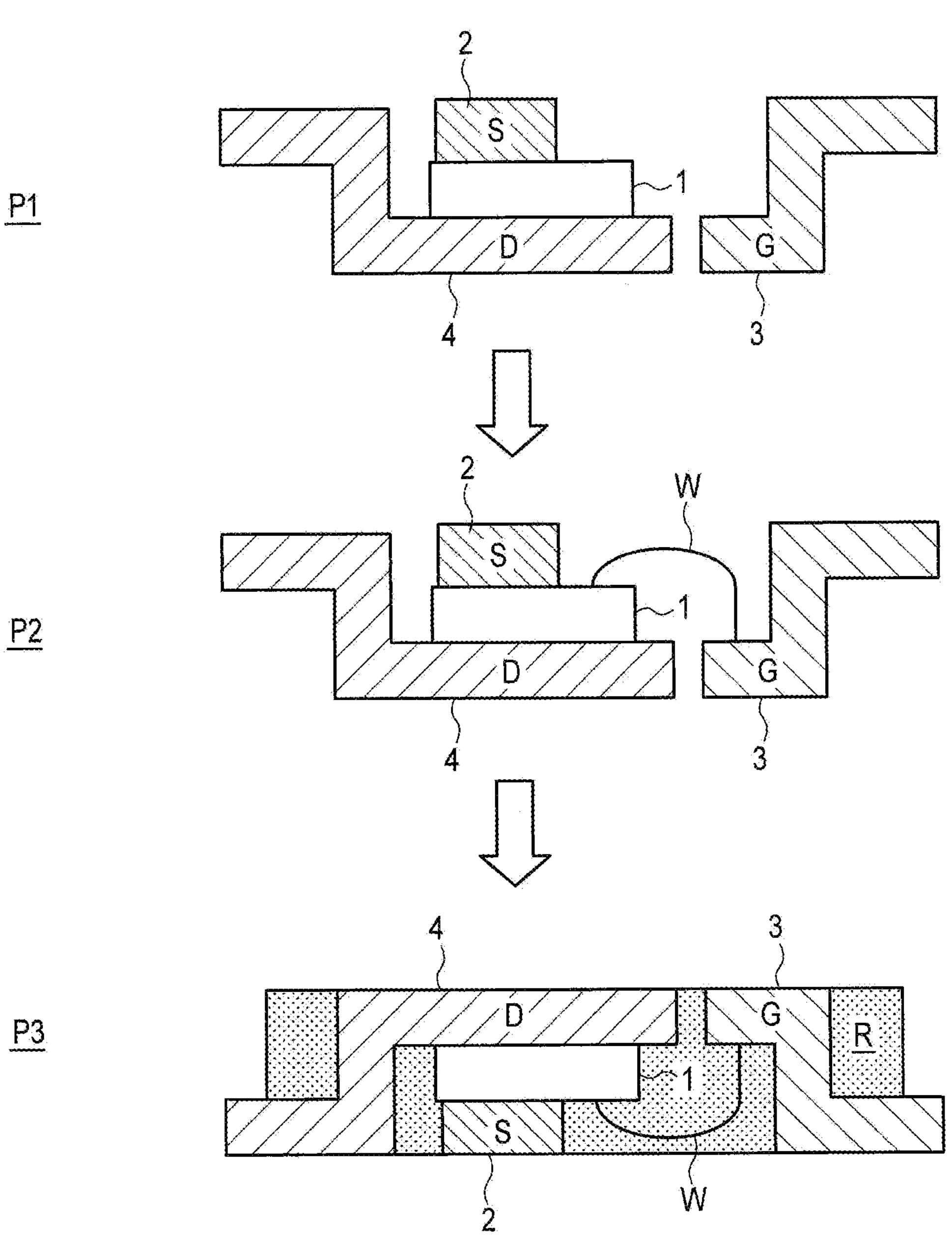
FIG. 3 is a diagram for explaining an outline of a manufacturing process of the semiconductor device.

In FIG. 3, an arrangement position, a shape, a size, etc. of each component are schematically shown so that a manufacturing procedure of the semiconductor device can be easily understood. Illustrations of each pad, solder, etc. are also omitted. Therefore, the actual arrangement position, shape, size, etc. of each component differ from those shown in FIG. 3.

In process P1, the drain electrode 4 and the gate electrode 3 made in advance using a lead frame with a dented head are arranged, the chip 1 is arranged on the drain electrode 4, and the source electrode 2 is arranged on the chip 1. In this state, reflow and cleaning processes are performed.

In process P2, wire connection (wire bonding) of the wire W is performed by ultrasonic welding. Here, one end of the wire W is connected to a predetermined region of the gate electrode 3 (the aforementioned predetermined region of the gate electrode internal connection portion 3B) while the other end of the wire W is connected to a predetermined region (corresponding to the aforementioned gate electrode pad 13) on the chip 1.

In process P3, a product made in process P2 is inverted, and the resin R is injected and sealed (mold forming process). Although illustration is omitted in FIG. 3, the resin R may also be present on the gate electrode 3 and the drain electrode 4. At a bottom portion of the device, the respective terminals (connectors) of the source electrode 2, the gate electrode 3, and the drain electrode 4 project outward in a horizontal direction.

The gate electrode 3 and the drain electrode 4 described in process P1 may be formed by separating one lead frame in advance. Separation can be done by a simple process such as cutting. Costly and time-consuming processes such as etching, etc. (e.g., half-etching and punch-out), which are commonly performed, are not necessary.

A product made in process P3 is a package in which the resin R is sealed to a structure consisting of the chip 1, the source electrode 2, the gate electrode 3, and the drain electrode 4.

In this case, the drain electrode 4 is arranged on a first surface of the chip 1. The source electrode 2 will be arranged on the second surface provided on a back side of the above first surface of the chip 1 and will have a front surface on the bottom surface of the device. The gate electrode 3 will also have a front surface on the bottom surface of the device. The wire W connects a first region of the gate electrode 3 (the aforementioned predetermined region of the gate electrode internal connection portion 3B) to a second region (corresponding to the aforementioned gate electrode pad 13) on the above second surface of the chip 1.

The drain electrode 4 will have a flat plate portion on the above second surface side of the chip 1, and the gate electrode 3 will have a flat plate portion at the same height as that of the flat plate portion of the drain electrode 4. In this case, the gate electrode 3 has the above first region to which the wire W is connected in a flat plate portion of the gate electrode 3.

(Specific Example of Manufacturing Process)

Next, a specific example of the manufacturing process of the semiconductor device according to the present embodiment will be described with reference to FIGS. 4 and 5.

Figure 4:
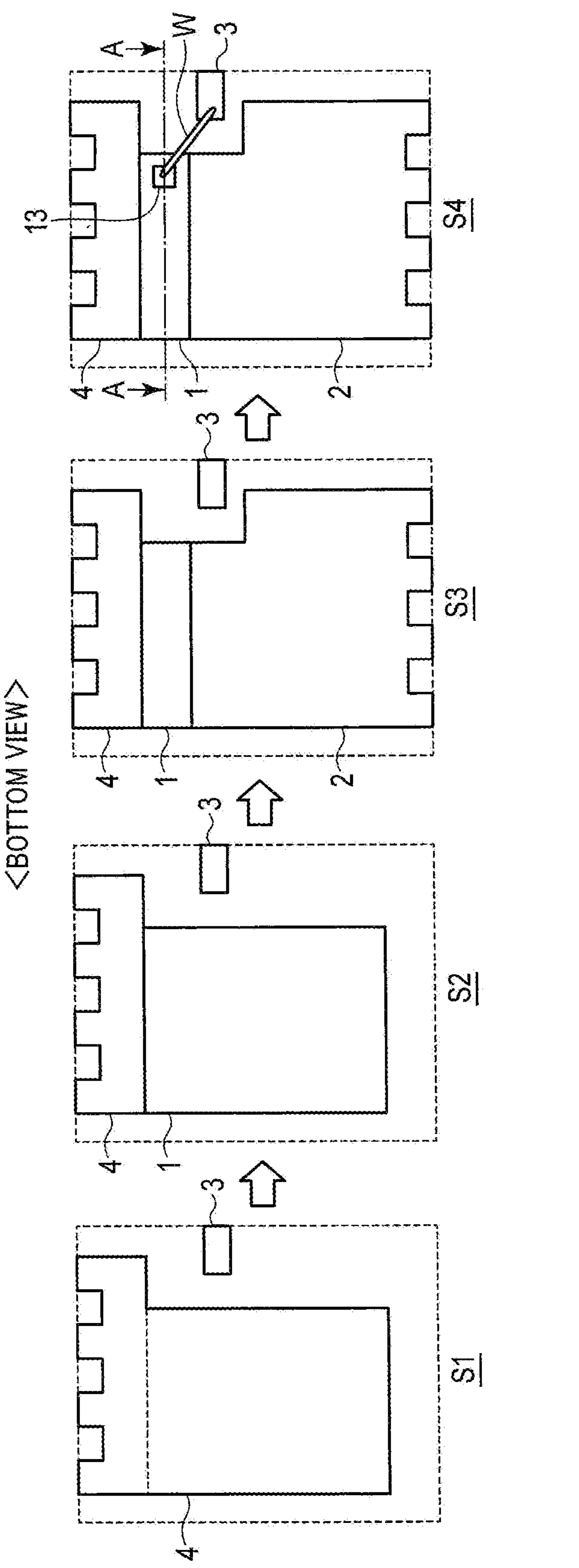
FIG. 4 is a diagram for explaining a specific example of a manufacturing process (first half) of the semiconductor device.

FIG. 4 shows a first half of the manufacturing process, where each process is performed with the semiconductor device upside down. FIG. 5 shows a second half of the manufacturing process, where each process is performed with the semiconductor device in its normal arrangement (a source-down state).

In step S1 in FIG. 4, a stepped frame is arranged upside down as the drain electrode 4.

In step S2, solder (or sintered material) in paste form is applied on the frame-shaped drain electrode 4 and the chip 1 is mounted.

In step S3, paste solder (or sintered material) is applied on the chip 1, and then the frame-shaped source electrode 2 is mounted. After this, the frame-shaped source electrode 2 and the frame-shaped drain electrode 4 may be fixed by swaging. By doing so, variations in heights of the drain electrode 4, the source electrode 2, and the gate electrode 3 after mold forming can be suppressed.

In step S4, reflow and cleaning processes are performed, followed by wire connection (wire bonding) of the wire W by ultrasonic welding. Here, one end of the wire W is connected to the predetermined region of the gate electrode 3 (the aforementioned predetermined region of the gate electrode internal connection portion 3B) while the other end of the wire W is connected to the predetermined region (corresponding to the aforementioned gate electrode pad 13) on the chip 1.

Figure 6:
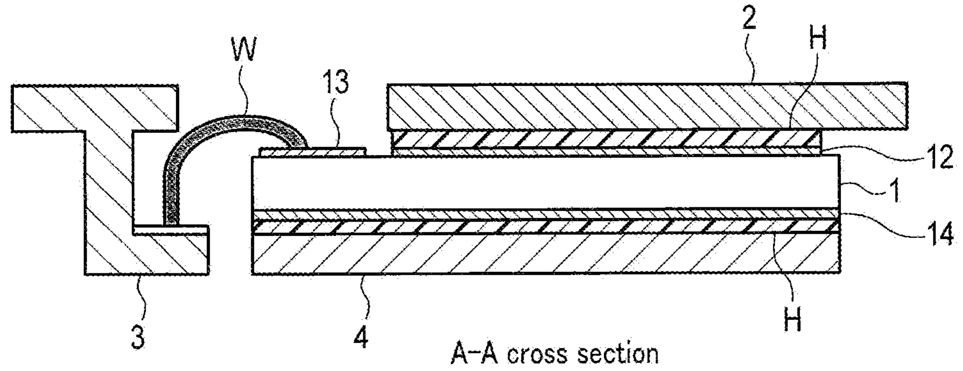
FIG. 6 is a diagram showing shapes of portions as seen in a cross-section A-A viewed in the arrow direction illustrated in step S4 in FIG. 4.

Shapes of portions in step S4 as seen in a cross-section A-A viewed in the arrow direction are shown in FIG. 6.

As shown in FIG. 6, solder (or sintered material) H is arranged on the drain electrode 4, the drain electrode pad 14 is arranged on the solder H, the chip 1 is arranged on the drain electrode pad 14, and the source electrode pad 12 and the gate electrode pad 13 are arranged on the chip 1.

The solder (or sintered material) H is arranged on the source electrode pad 12, and the source electrode 2 is arranged on the solder H. The wire W connects the first region of the gate electrode 3 (the aforementioned predetermined region of the gate electrode internal connection portion 3B) to the above second region (i.e., the gate electrode pad 13) on the second surface of the chip 1.

Figure 5:
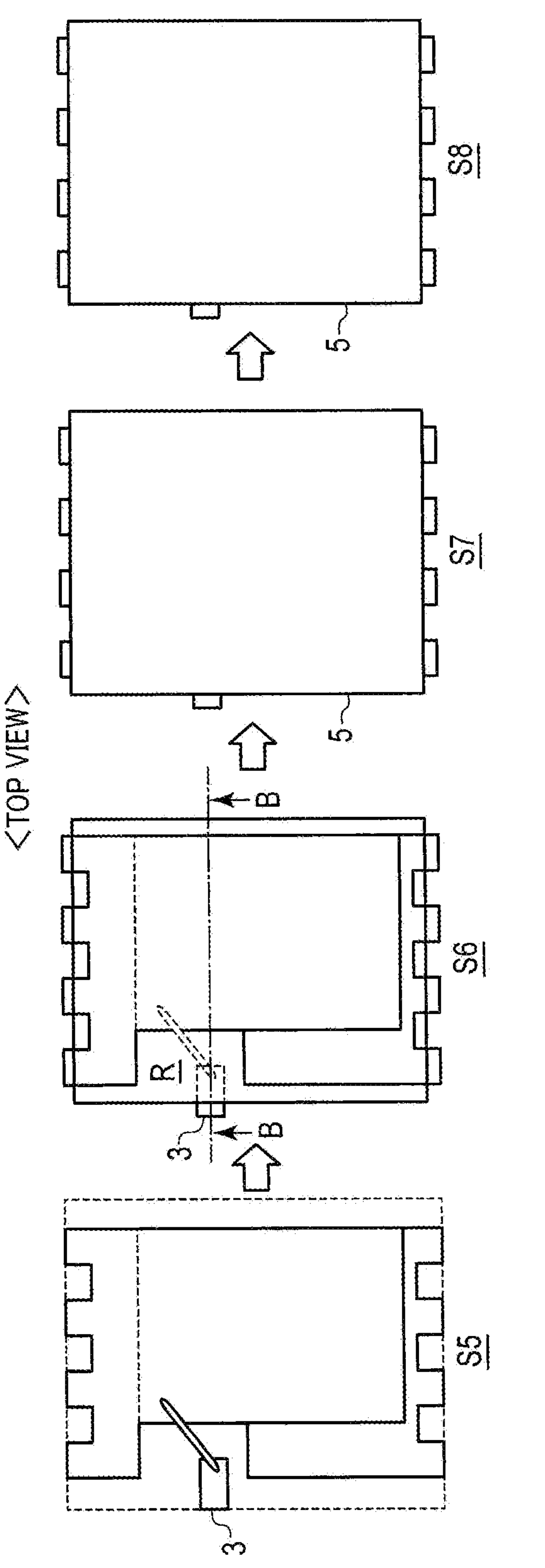
FIG. 5 is a diagram for explaining a specific example of a manufacturing process (second half) of the semiconductor device.

In step S5 in FIG. 5, a product made in step S4 is inverted.

In step S6, mold forming is performed for each device (each package).

Figure 7:
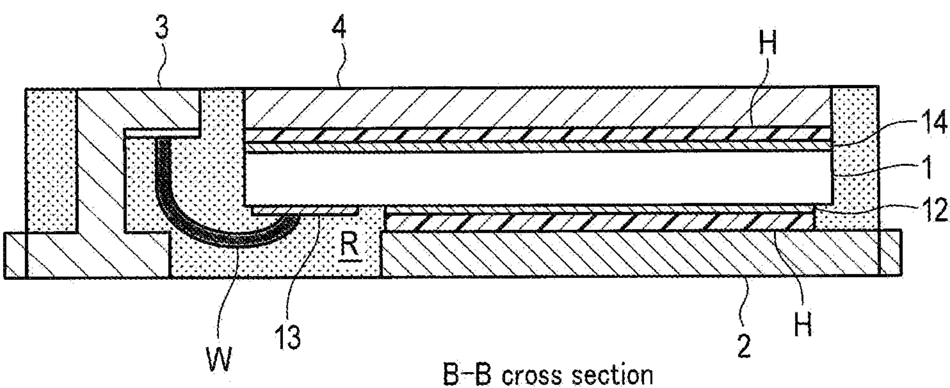
FIG. 7 is a diagram showing shapes of portions as seen in a cross-section B-B viewed in the arrow direction illustrated in step S6 in FIG. 5.

Shapes of portions in step S6 as seen in a cross-section B-B viewed in the arrow direction are shown in FIG. 7.

As can be seen from a comparison with FIG. 6, FIG. 7 shows the configuration shown in FIG. 6 upside down, with the resin R sealed.

In step S7, the exterior is plated, and in step S8, necessary and unnecessary portions are separated by cutting using a die.

According to this example, the process of mold forming for each device (each package) in step S6 results in a structure in which the respective terminals of the source electrode 2, the gate electrode 3, and the drain electrode 4 protrude from the surface of the sealing resin by a predetermined distance when a product is finished. However, the structure is not limited to this example. For example, the entire lead frame may be batch molded in steps S1 to S5, and the batch molded lead frame may be broken into pieces by blade dicing in step S6 to form a cuboid package without protrusions.

According to the embodiments, by connecting the predetermined region of the gate electrode 3 to the gate electrode pad 13 on the chip 1 with the wire W, the region of the gate electrode pad 13 on the chip 1 can be made small and the region on the chip 1 other than this region can be made large, thus ensuring a large active area.

Since the area of the bonding portion with the wire W can be reduced, the durability of the bonding portion against thermal stress due to heat generation from the chip 1 can be improved, which can extend the service life of the component and realize cost reduction.

Furthermore, by connecting the plate-shaped gate electrode 3 to the gate electrode pad 13 on the chip 1 with the wire W, the region of the gate electrode pad 13 can be kept small and a large region can be easily secured for the gate electrode external exposed part 3A, which connects to an external entity.

(Modification)

The structure of the semiconductor device shown in FIGS. 1 and 2 is intended to be an example and does not pose any limitations. In some instances, a part of the shown structure may be changed or modified.

An exemplary modification of the semiconductor device shown in FIGS. 1 and 2 will be described using FIGS. 8 and 9.

Figure 8:
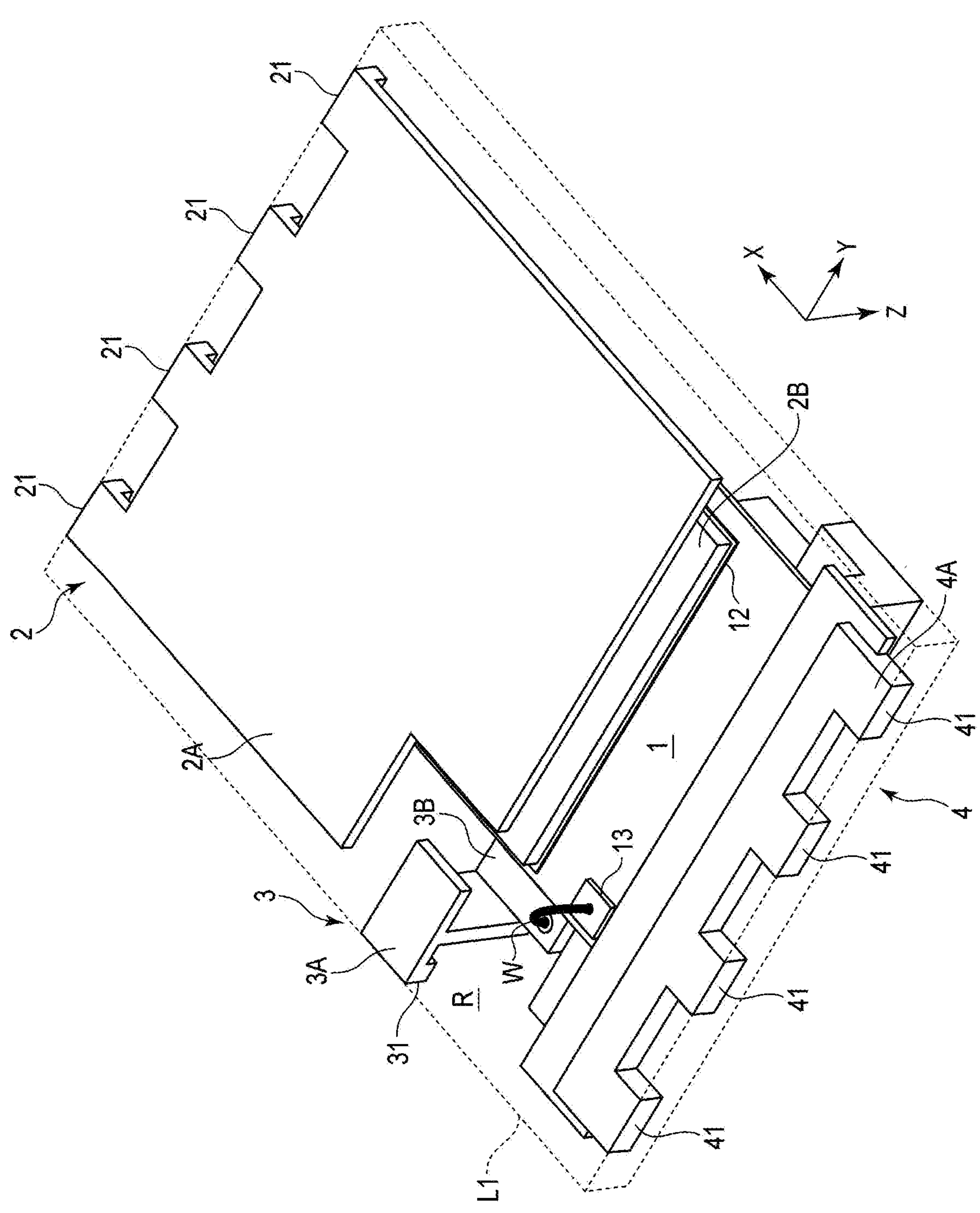
FIG. 8 is a perspective view showing a modification of the semiconductor device shown in FIG. 1.

FIG. 8 is a perspective view showing one modification of the semiconductor device shown in FIG. 1. Also, FIG. 9 is a plan view showing one example of the structure of the modification of the semiconductor device shown in FIG. 8, as viewed in the Z direction. The description will basically concentrate on differences from the structure shown in FIGS. 1 and 2.

Figure 9:
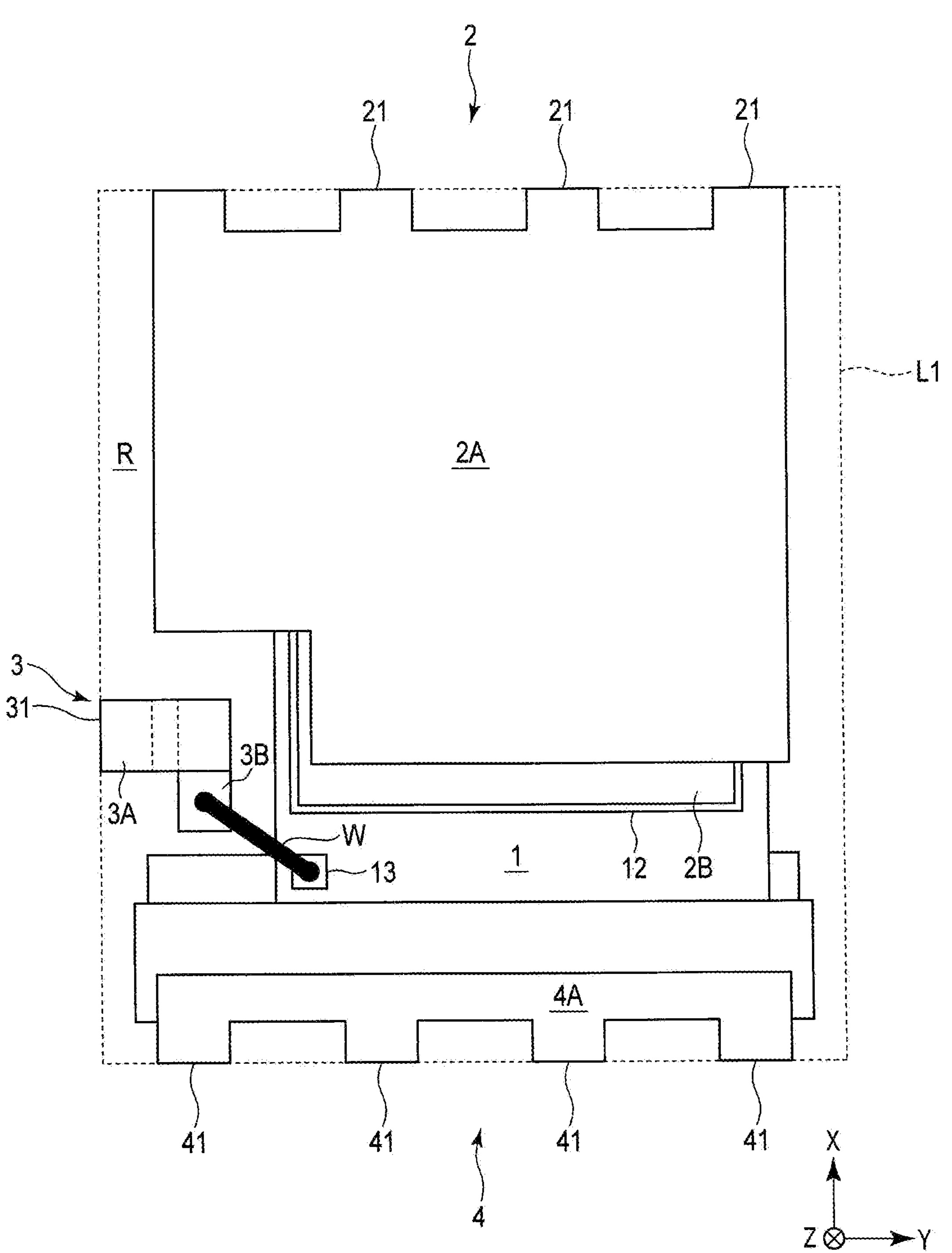
FIG. 9 is a plan view showing an example of a structure of the modification of the semiconductor device shown in FIG. 8, as viewed in the Z direction.

The semiconductor device shown in FIGS. 8 and 9 differs from the semiconductor device shown in FIGS. 1 and 2 in the structure of the gate electrode internal connection portion 3B and also the position where the wire W makes a connection (wire bonding) to the gate electrode internal connection portion 3B.

More specifically, as compared to the semiconductor device shown in FIGS. 1 and 2, the semiconductor device shown in FIGS. 8 and 9 has the gate electrode internal connection portion 3B partially extending in the direction opposite the X direction so that, as viewed in the Z direction, the gate electrode internal connection portion 3B is seen to be partially stick out from the gate electrode external exposed portion 3A. The wire W is connected onto the surface of such a sticking out part of the gate electrode internal connection portion 3B. The gate electrode external exposed portion 3A (eaves-like member) is absent in the direction opposite the Z direction from this position where the wire W is connected. That is, when the semiconductor device is viewed in the Z direction, the gate electrode internal connection portion 3B partially extends in the direction opposite the X direction in comparison with the gate electrode external exposed portion 3A.

By adopting such a structure, it is possible to eliminate a risk of a bonding tool coming into contact with the gate electrode external exposed portion 3A (eaves-like member) during the process of connecting the wire W to the gate electrode internal connection portion 3B using the bonding tool. Accordingly, it is possible to surely connect the wire W to the gate electrode external exposed portion 3A electrically, not causing defects in the gate electrode external exposed portion 3A, resulting in a highly reliable semiconductor device.

Generally, a bonding tool is set at a position directly above the position to form a wire connection. With the structure shown in FIGS. 8 and 9, the bonding tool can be kept away from the gate electrode external exposed portion 3A (eaves-like member) in the course of the wire connection process, and as such, the structure can promote the wire connection process as it secures the space for the bonding tool.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. A semiconductor device comprising:

a chip;

a drain electrode arranged on a first surface of the chip;

a source electrode arranged on a second surface provided on a back side of the first surface of the chip and having a front surface on a device bottom surface;

a gate electrode having a front surface on the device bottom surface; and a wire connecting a first region of the gate electrode to a second region on the second surface of the chip, wherein the drain electrode and the gate electrode are formed with a single lead frame with a dented head, and the first region of the gate electrode is located at an inner surface of the dented head.

2. The semiconductor device according to claim 1, wherein the drain electrode has a flat plate portion on a side of the second surface of the chip, and the gate electrode has a flat plate portion at the same height as the flat plate portion of the drain electrode.

3. The semiconductor device according to claim 2, wherein the gate electrode has the first region in a flat plate portion of the gate electrode, the first region being connected to the wire.

4. The semiconductor device according to claim 1, wherein the source electrode and the drain electrode are bonded to the chip with solder.

5. The semiconductor device according to claim 1, wherein the source electrode and the drain electrode are bonded to the chip with a pressure-sintered material.

6. The semiconductor device according to claim 1, wherein the semiconductor device is sealed in a package of a source-down structure in which the source electrode is provided on a bottom surface of the package.

7. A semiconductor device comprising:

a chip;

a drain electrode arranged on a first surface of the chip;

a source electrode arranged on a second surface provided on a back side of the first surface of the chip and having a connection portion and an external exposed portion, the connection portion being connected to the second surface, the external exposed portion being exposed on a side opposite to the connection portion;

a gate electrode being formed by bending a plate-like metal member; and a wire connecting a first region of the gate electrode to a second region on the second surface of the chip, wherein the drain electrode and the gate electrode are formed with a single lead frame with a dented head, and the first region of the gate electrode is located at an inner surface of the dented head.

8. The semiconductor device according to claim 7, wherein when viewed from a direction perpendicular to the second surface of the chip, the external exposed portion of the source electrode has a region that overlaps with the second surface of the chip.

* * * * *